U S009536861B2

(12) United States Patent
Yu et al.

(10) Patent No.: US 9,536,861 B2
(45) Date of Patent: Jan. 3, 2017

(54) SEMICONDUCTOR PACKAGE INCLUDING A PLURALITY OF STACKED CHIPS

(71) Applicant: SK hynix Inc., Icheon-si Gyeonggi-do (KR)

(72) Inventors: Jae Woong Yu, Guri-si (KR); Jong Seo Jung, Yongin-si (KR); So Hyun Jung, Busan (KR); Seong Cheol Shin, Yeoju-si (KR)

(73) Assignee: SK HYNIX INC., Icheon-Si (KR)

( * ) Notice: Subject to any disclaimer, the term of this patent is extended or adjusted under 35 U.S.C. 154(b) by 0 days.

(21) Appl. No.: 14/692,429

(22) Filed: Apr. 21, 2015

(65) Prior Publication Data
US 2016/0172331 A1 Jun. 16, 2016

(30) Foreign Application Priority Data

Dec. 15, 2014 (KR) .......................... 10-2014-0179994

(51) Int. Cl.
*H01L 25/065* (2006.01)
*H01L 23/31* (2006.01)
(Continued)

(52) U.S. Cl.
CPC .......... *H01L 25/0652* (2013.01); *H01L 23/13* (2013.01); *H01L 23/3114* (2013.01); *H01L 23/3142* (2013.01); *H01L 23/49816* (2013.01); *H01L 23/5384* (2013.01); *H01L 24/06* (2013.01); *H01L 24/32* (2013.01); *H01L 24/33* (2013.01); *H01L 24/45* (2013.01); *H01L 24/48* (2013.01); *H01L 24/49* (2013.01); *H01L 24/73* (2013.01); *H01L 24/92* (2013.01); *H01L 25/18* (2013.01);
(Continued)

(58) Field of Classification Search
CPC .................. H01L 2924/00; H01L 2924/00012; H01L 2224/4824; H01L 2224/32225; H01L 2224/73215; H01L 2924/15311; H01L 2225/0651; H01L 25/0657; H01L 2225/06562
USPC ................................ 257/777, 686, 778, 784, E25.013,257/E21.499, E23.011, E23.085, E25.001,257/E25.006; 361/735; 438/108, 109, 123
See application file for complete search history.

(56) References Cited

U.S. PATENT DOCUMENTS 6,703,713 B1 * 3/2004 Tseng .................. H01L 23/3114 257/723
2005/0199993 A1 * 9/2005 Lee ......................... H01L 23/02 257/686
(Continued)

*Primary Examiner* — David Vu
*Assistant Examiner* — Jonathan Han
(74) *Attorney, Agent, or Firm* — William Park & Associates Ltd.

(57) ABSTRACT

A semiconductor package may include a substrate having a first surface and a second surface facing away from the first surface, a window defined through a center portion of the substrate, and a plurality of first bond fingers, a plurality of second bond fingers, and a plurality of external electrodes arranged on the second surface; two or more first semiconductor chips each having a plurality of first bonding pads arranged adjacent to edges of the first semiconductor chips, and each of the first semiconductor chips separately attached to the first surface of the substrate in a face-down type position exposing the first bonding pads; and a second semiconductor chip having a plurality of second bonding pads arranged at a center portion of the second semiconductor chip, and attached to each of the first semiconductor chips in a face-down type position exposing the second bonding pads through the window.

17 Claims, 8 Drawing Sheets

(51) Int. Cl.
  *H01L 23/13*         (2006.01)
  *H01L 23/498*        (2006.01)
  *H01L 23/538*        (2006.01)
  *H01L 23/00*             (2006.01)
  *H01L 25/18*             (2006.01)
(52) U.S. Cl.
  CPC ............ *H01L 2224/04042* (2013.01); *H01L 2224/05554* (2013.01); *H01L 2224/06135* (2013.01); *H01L 2224/06136* (2013.01); *H01L 2224/32145* (2013.01); *H01L 2224/32225* (2013.01); *H01L 2224/33181* (2013.01); *H01L 2224/45139* (2013.01); *H01L 2224/45144* (2013.01); *H01L 2224/45147* (2013.01); *H01L 2224/4824* (2013.01); *H01L 2224/49175* (2013.01); *H01L 2224/73215* (2013.01); *H01L 2224/92147* (2013.01); *H01L 2225/0651* (2013.01); *H01L 2225/06562* (2013.01); *H01L 2924/1431* (2013.01); *H01L 2924/1434* (2013.01); *H01L 2924/15151* (2013.01); *H01L 2924/15311* (2013.01); *H01L 2924/1815* (2013.01); *H01L 2924/18165* (2013.01)

(56) References Cited

U.S. PATENT DOCUMENTS

| | | | |
|---|---|---|---|
| 2006/0197206 A1* | 9/2006 | Kim | H01L 25/0657 257/686 |
| 2012/0267796 A1* | 10/2012 | Haba | H01L 23/50 257/777 |
| 2013/0168843 A1* | 7/2013 | Zohni | H01L 23/433 257/706 |
| 2014/0175673 A1* | 6/2014 | Kim | H01L 24/73 257/777 |

* cited by examiner

SEMICONDUCTOR PACKAGE INCLUDING A PLURALITY OF STACKED CHIPS

CROSS-REFERENCES TO RELATED APPLICATION

The present application claims priority under 35 U.S.C. §119(a) to Korean Patent Application No. 10-2014-0179994 filed on Dec. 15, 2014, in the Korean Intellectual Property Office, which is incorporated herein by reference in its entirety.

BACKGROUND

1. Technical Field

Various embodiments generally relate to a semiconductor package, and more particularly, to a multi-chip package including a plurality of stacked chips.

2. Related Art

As electronic products are gradually downsized and highly functionalized, semiconductor chips with higher capacities are needed to satisfy desired functions. Thus, there is a need to mount an increased number of semiconductor chips on a small-sized product.

Since technologies for manufacturing semiconductor chips with higher capacities or mounting an increased number of semiconductor chips in a limited space has limitations, a recent trend is directed to embed an increased number of semiconductor chips in a single package.

In addition, various technologies for improving electrical characteristics without increasing the overall thickness of a package even though one or more semiconductor chips are embedded are being developed.

SUMMARY

In an embodiment, a semiconductor package may include a substrate having a first surface and a second surface facing away from the first surface, a window defined through a center portion of the substrate, and a plurality of first bond fingers, a plurality of second bond fingers, and a plurality of external electrodes arranged on the second surface. The semiconductor package may include two or more first semiconductor chips each having a plurality of first bonding pads arranged adjacent to edges of the first semiconductor chips, and each of the first semiconductor chips separately attached to the first surface of the substrate in a face-down type position exposing the first bonding pads. The semiconductor package may include a second semiconductor chip having a plurality of second bonding pads arranged at a center portion of the second semiconductor chip, and attached to each of the first semiconductor chips in a face-down type position exposing the second bonding pads through the window.

In an embodiment, an electronic system including a semiconductor package may include a controller, an interface, an input/output unit and a memory device coupled to a bus, the controller and the memory device including a semiconductor package. The semiconductor package may include a substrate having a first surface and a second surface facing away from the first surface, a window defined through a center portion of the substrate, and a plurality of first bond fingers, a plurality of second bond fingers, and a plurality of external electrodes arranged on the second surface. The semiconductor package may include first semiconductor chips having a plurality of first bonding pads arranged adjacent to edges of the first semiconductor chips, and each of the first semiconductor chips separately attached to the first surface of the substrate in a face-down type position exposing the first bonding pads. The semiconductor package may include a second semiconductor chip having a plurality of second bonding pads arranged at a center portion of the second semiconductor chip, and attached to each of the first semiconductor chips in a face-down type position exposing the second bonding pads through the window.

In an embodiment, a memory card including a semiconductor package may include a memory including the semiconductor package and a memory controller for controlling the memory. The semiconductor package may include a substrate having a first surface and a second surface facing away from the first surface, a window defined through a center portion of the substrate, and a plurality of first bond fingers, a plurality of second bond fingers, and a plurality of external electrodes arranged on the second surface. The semiconductor package may include first semiconductor chips having a plurality of first bonding pads arranged adjacent to edges of the first semiconductor chips, and each of the first semiconductor chips separately attached to the first surface of the substrate in a face-down type position exposing the first bonding pads. The semiconductor package may include a second semiconductor chip having a plurality of second bonding pads arranged at a center portion of the second semiconductor chip, and attached to each of the first semiconductor chips in a face-down type position exposing the second bonding pads through the window.

DETAILED DESCRIPTION

Figure 1:
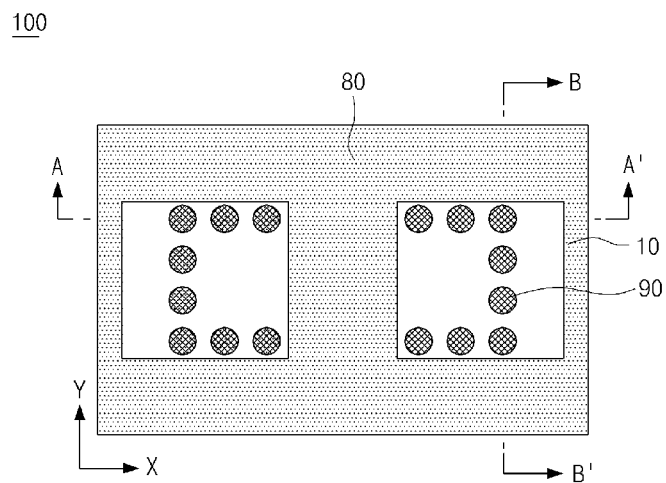
FIG. 1 is a bottom view illustrating a representation of an example of a semiconductor package in accordance with an embodiment.
Figure 2:
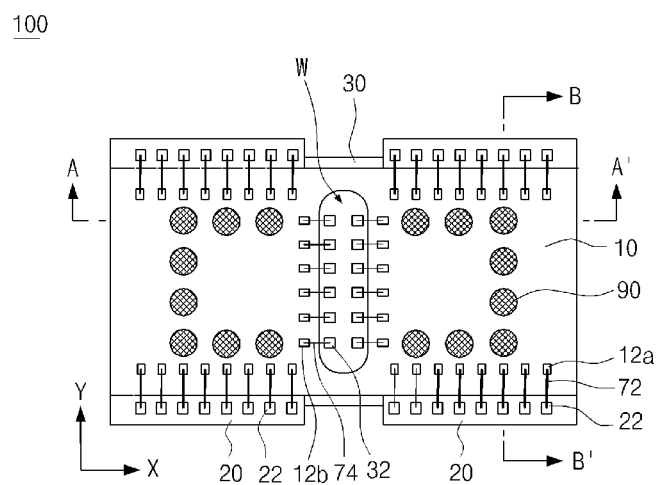
FIG. 2 is a bottom view illustrating the semiconductor package of FIG. 1 with an encapsulation member removed.
Figure 3:
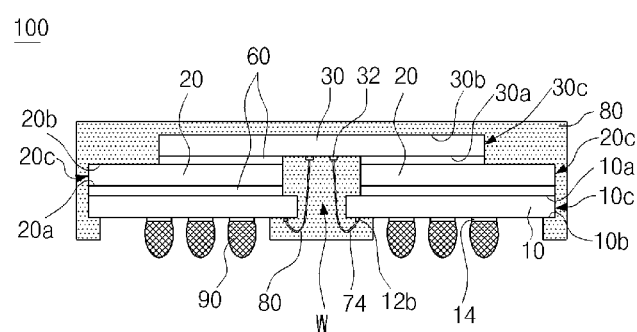
FIG. 3 is a cross-sectional view taken along the line A-A' of FIG. 1.
Figure 4:
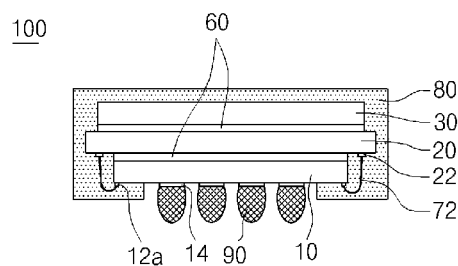
FIG. 4 is a cross-sectional view taken along the line B-B' of FIG. 1.

Hereinafter, a semiconductor package including a plurality of stacked chips will be described below with reference to the accompanying drawings through various examples of embodiments.

Various embodiments may be directed to a semiconductor package capable of realizing a thin package even though a plurality of semiconductor chips is embedded.

Various embodiments may be directed to a semiconductor package including improved electrical characteristics through the modification of the structure of a substrate.

Various embodiments may be directed to a semiconductor package configured for suppressing the occurrence of a short circuit due to the prevention of an interference even with the use of multiple wires or interconnections.

Referring to FIGS. 1 to 4, a semiconductor package 100 in accordance with an embodiment may include a substrate 10, first and second semiconductor chips 20 and 30, respectively. The semiconductor package 100 may include first and second connection members 72 and 74, respectively. The semiconductor package 100 in accordance with an embodiment may further include adhesive members 60, an encapsulation member 80, and connection terminals 90.

The substrate 10 may be, for example, a printed circuit board. The substrate 10 may have a substantially quadrangular plate shape. The substrate 10 has a first surface 10a and a second surface 10b facing away from the first surface 10a. The substrate 10 may include a window W defined through the center portion thereof (i.e., the substrate 10). The substrate 10 may include a plurality of first bond fingers 12a, a plurality of second bond fingers 12b, and a plurality of external electrodes 14. The first bond fingers 12a, the plurality of second bond fingers 12b, and the plurality of external electrodes 14 may be arranged on the second surface 10b.

The window W may be defined through the center portion of the substrate 10. Such a window W may be defined to have a substantially rectangular sectional shape extending in a second direction Y and may be rounded at both ends thereof, when viewed from the bottom. The window W may have a size exposing all second bonding pads 32. The bonding pads 32 may be arranged on the center portion of the second semiconductor chip 30.

The first bond fingers 12a may be arranged in a first direction X adjacent to both edges of the substrate 10, and the second bond fingers 12b may be arranged in the second direction Y perpendicular or substantially perpendicular to the first direction X adjacent to the edge portions of the substrate 10 defining the window W. The first bond fingers 12a and the second bond fingers 12b may not be arranged in the first direction X at portions adjacent to the window W. While the first direction is described as the X direction and the second direction is described as the Y direction in an embodiment, it is to be noted that, as the occasion demands, the X direction and the Y direction may be reversed with each other.

The external electrodes 14 may serve as portions to which the connection terminals 90 for connection to external circuits, such as solder balls, are to be attached. The external electrodes 14 may be formed to have pad shapes. The external electrodes 14 may be arranged at portions surrounded by the first and second bond fingers 12a and 12b, except the outer ends thereof in the first direction X, on the second surface 10b of the substrate 10.

The first bond fingers 12a and the external electrodes 14 may be electrically connected with each other and the second bond fingers 12b and the external electrodes 14 may be electrically connected with each other, by the traces formed on the second surface 10b of the substrate 10 or the internal lines formed in the substrate 10. In an embodiment, first bond fingers 12a and the second bond fingers 12b may also be electrically connected with each other by traces or internal lines.

Each of the first semiconductor chips 20 may have a quadrangular plate shape having an upper surface 20a and a lower surface 20b facing away from the upper surface 20a. Each of the first semiconductor chips 20 may be an edge-pad type chip in which a plurality of first bonding pads 22 are arranged in the first direction X adjacent to the edges of the upper surface 20a. Two such first semiconductor chips 20 are attached to the first surface 10a of the substrate 10 such that they are respectively disposed on both sides of the window W in the first direction X. The first semiconductor chips 20 may be attached such that outer side surfaces 20c of the first semiconductor chips 20 are flush or substantially flush with corresponding side surfaces 10c of the substrate 10 when viewed in the second direction Y.

The two first semiconductor chips 20 may be attached in a face-down type to the first surface 10a of the substrate 10 on both sides of the window W in such a manner that the upper surfaces 20a thereof face the first surface 10a of the substrate 10 and the edges thereof, adjacent to which the first bonding pads 22 are arranged, project out of the substrate 10 in the second direction Y. In an embodiment, the two first semiconductor chips 20 may be attached to the first surface 10a of the substrate 10 in a position facing downward toward the first surface 10a. The two first semiconductor chips 20 may be located on both sides of the window W in such a manner that the upper surfaces 20a of the first semiconductor chips 20 face the first surface 10a of the substrate 10. The edges of the first semiconductor chips 20, adjacent to the arrangement of the first bonding pads 22, project out from the perimeter of the substrate 10 in the second direction Y (i.e., see FIG. 4). Accordingly, each of the first semiconductor chips 20 have a width larger than the width of the substrate 10 in the second direction Y (i.e., see FIG. 4) and have a length shorter than the length measured from the side surface 10c of the substrate 10 to the window W in the first direction X (i.e., see FIG. 3).

Each such first semiconductor chip 20 may be a memory chip, and may include therein internal circuits (not illustrated) formed to be electrically connected with the plurality of first bonding pads 22.

The second semiconductor chip 30 may have a quadrangular plate shape having an upper surface 30a and a lower surface 30b facing away from the upper surface 30a. The second semiconductor chip may be a center-pad type chip including a plurality of second bonding pads 32 arranged in one line or two lines, for example, two lines, at the center portion of the upper surface 30a (i.e., see FIG. 2). In an embodiment, the second semiconductor chip 30 may be a memory chip in the same manner as the first semiconductor chip 20, and may include therein internal circuits (not illustrated) formed to be electrically connected with the plurality of second bonding pads 32. In an embodiment, the second semiconductor chip 30 may be a logic chip. The second semiconductor chip 30 may be attached to the first semiconductor chips 20 over the window W in a face-down type such that the upper surface 30a thereof faces the lower surfaces 20b of the first semiconductor chips 20 and the second bonding pads 32 thereof are exposed through the window W of the substrate 10. In an embodiment, the second semiconductor chip 30 may be attached to the first semiconductor chips 20 over the window W in a face down position whereby the upper surface 30a faces toward the lower surfaces 20b of the first semiconductor chips 20. The second bonding pads 32 of the second semiconductor chip 30 may be exposed through the window W of the substrate 10 (i.e., see FIGS. 2 and 3). In an embodiment, the second semiconductor chip 30 may have a length longer than the first semiconductor chip 20 in the first direction X and a width larger than the substrate 10 and smaller than the first semiconductor chip 20 in the second direction Y.

The adhesive members 60 may include adhesive tapes or adhesive pastes. The adhesive members 60 may be interposed between the first surface 10a of the substrate 10 and the upper surfaces 20a of the first semiconductor chips 20. The adhesive members 60 may be interposed between the lower surfaces 20b of the first semiconductor chips 20 and the upper surface 30a of the second semiconductor chip 30.

The first connection members 72 are formed to electrically connect the first bond fingers 12a of the substrate 10 and the first bonding pads 22 of the first semiconductor chips 20 arranged adjacent to the first bond fingers 12a of the substrate 10. The first connection members 72 may be conductive wires formed of a metallic material, for example but not limited to, gold, silver or copper.

The second connection members 74 are formed to electrically connect the second bonding pads 32 of the second semiconductor chip 30, exposed through the window W of the substrate 10, and the second bond fingers 12b of the substrate 10, arranged adjacent to the second bonding pads 32 of the second semiconductor chip 30. The second connection members 74 may be conductive wires formed of a metallic material, for example but not limited to, gold, silver or copper.

The encapsulation member 80 may be formed to protect the first and second semiconductor chips 20 and 30 and the first and second connection members 72 and 74. In an embodiment, the encapsulation member 80 may be formed on the first surface 10a of the substrate 10 to cover the lower surface 30b and side surfaces 30c of the second semiconductor chip 30. In an embodiment, the encapsulation member 80 may be formed in the first direction X in such a way as to cover the edge portions of the first semiconductor chips 20 including the first bonding pads 22 and the edge portions of the substrate 10 including the first bond fingers 12a, to cover the first bond fingers 12a, the first bonding pads 22 and the first connection members 72 formed to electrically connect the first bond fingers 12a and the first bonding pads 22 with each other. In an embodiment, the encapsulation member 80 may be formed in the window W and on the portion of the second surface 10b of the substrate 10 around the window W to cover the second bond fingers 12b, the second bonding pads 32 and the second connection members 74 formed to electrically connect the second bond fingers 12b and the second bonding pads 32, and fill the window W. The encapsulation member 80 may include, for example but not limited to, an epoxy molding compound.

The connection terminals 90 may be provided for mounting the semiconductor package 100 in accordance with the various embodiments to an external circuit, and may be respectively attached to the external electrodes 14 arranged on the second surface 10b of the substrate 10. Such connection terminals 90 may be, for example but not limited to, solder balls. In an embodiment, the connection terminals 90 may be any one of or combination of, for example but not limited to, conductive pastes, conductive patterns and conductive pins.

In an embodiment, the encapsulation member 80 may be formed in the second direction Y to cover the edge portions including the side surfaces 10c of the substrate 10 and the side surfaces 20c of the first semiconductor chips 20. In an embodiment, the encapsulation member 80 may be formed in the second direction Y to expose the side surfaces 10c of the substrate 10 and/or the side surfaces 20c of the first semiconductor chips 20.

Figure 5:
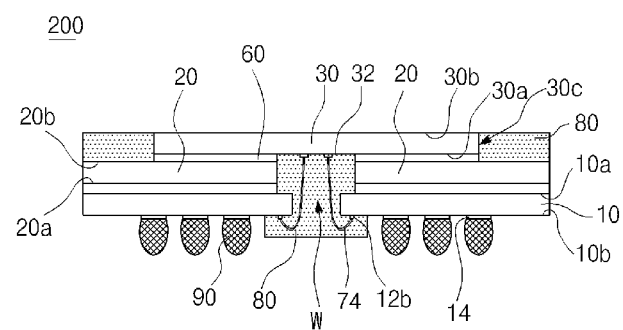
FIGS. 5 and 6 are cross-sectional views illustrating a representation of an example of a semiconductor package in accordance with an embodiment.
Figure 6:
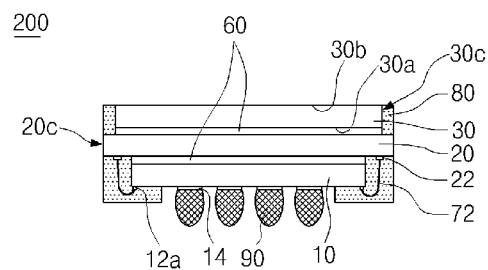

Referring to FIGS. 5 and 6, in a semiconductor package 200 in accordance with an embodiment, the encapsulation member 80 may be formed not to cover the lower surface 30b of the second semiconductor chip 30 and to cover the side surfaces 30c of the second semiconductor chip 30, and may be formed in the first direction X on the edge portions of the upper surfaces 20a and the lower surfaces 20b of the first semiconductor chips 20 in such a way as not to cover the side surfaces 20c of the first semiconductor chips 20. The semiconductor package 200 in accordance with an embodiment, due to the fact that the lower surface 30b of the second semiconductor chip 30 is exposed out of the encapsulation member 80, the heat generated from the first semiconductor chips 20 and the second semiconductor chip 30 may be quickly dissipated to an exterior.

In the semiconductor package 100 in accordance with the embodiments described above, the substrate 10 may have a structure in which all the first and second bond fingers 12a and 12b and the external electrodes 14 are arranged on the same surface, that is, the second surface 10b. In an embodiment where the bond fingers 12a and 12b and the external electrodes 14 are disposed on the same surface in this way, in particular, in an embodiment where lines for signal exchange are disposed on a single layer, since paths such as vias used for signal transfer in a multi-layered structure are not needed, signal transfer paths may be shortened and improved signal transfer characteristics may be achieved.

Because spatial limitations do not exist in terms of the shapes of wires over the first surface 10a of the substrate 10, the semiconductor package 100 (i.e., semiconductor package 200) in accordance with the embodiments may be realized as a thin package even though the plurality of semiconductor chips 20 and 30 are stacked.

Because interference among the connection members 72 and 74 between the stacked semiconductor chips 20 and 30 and the substrate 10, for example, conductive wires, is reduced, a short circuit issue may not occur in the semiconductor package 100 (i.e., semiconductor package 200) in accordance with the embodiments.

Figure 7:
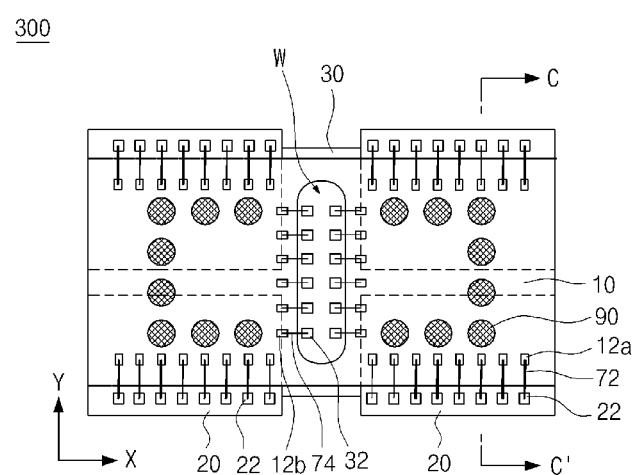
FIG. 7 is a bottom view illustrating a representation of an example of a semiconductor package with an encapsulation member removed, in accordance with an embodiment.
Figure 8:
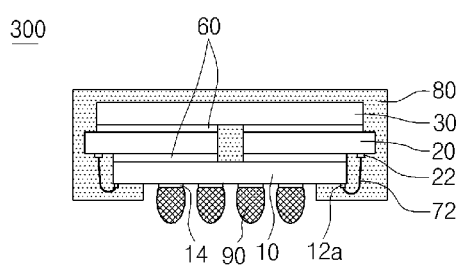
FIG. 8 is a cross-sectional view taken along the line C-C' of FIG. 7.

Referring to FIGS. 7 and 8, a semiconductor package 300 in accordance with an embodiment may include a substrate 10. The semiconductor package 300 may include first and second semiconductor chips 20 and 30, respectively. The semiconductor package 300 may include first and second connection members 72 and 74, respectively. The semiconductor package 300 in accordance with an embodiment may further include adhesive members 60, an encapsulation member 80, and connection terminals 90.

The substrate 10 may be, for example, a printed circuit board having a quadrangular plate shape. The substrate 10 has a first surface (i.e., first surface 10a of FIG. 5) and a second surface (i.e., second surface 10b of FIG. 5) facing away from the first surface, and includes a window W defined through the center portion of the substrate 10. The substrate 10 may include a plurality of first bond fingers 12a, a plurality of second bond fingers 12b and a plurality of external electrodes 14, arranged on the second surface of substrate 10.

The window W is defined through the center portion of the substrate 10 such that the window W extends in a second direction Y and all second bonding pads 32 of the second semiconductor chip 30 are exposed through the window W, when viewed from the bottom. The first bond fingers 12a may be arranged in a first direction X adjacent to both edges of the substrate 10, and the second bond fingers 12b may be arranged in the second direction Y substantially perpendicular to the first direction X adjacent to the edge portions of the substrate 10 defining the window W. The external electrodes 14 may serve as portions to which the connection terminals 90 such as solder balls are to be attached, and may be arranged at portions surrounded by the first and second bond fingers 12a and 12b, except the outer ends thereof in the first direction X, on the second surface of the substrate 10.

The first bond fingers 12a and the external electrodes 14 may be electrically connected with each other. The second bond fingers 12b and the external electrodes 14 may be electrically connected with each other. In an embodiment, the first bond fingers 12a and the second bond fingers 12b may also be electrically connected with each other.

Each of the first semiconductor chips 20 have a structure in which a plurality of first bonding pads 22 are arranged in the first direction X adjacent to one outer edge of the first semiconductor chips. The first semiconductor chips 20 may be arranged such that two first semiconductor chips 20 are disposed on each side of the window W on the first surface of the substrate 10 in such a way as to be separated from each other and such that the outer edges of the first semiconductor chips 20, adjacent to which the first bonding pads 22 are arranged, project out of the edges of the substrate 10.

Each of the first semiconductor chips 20 do not have a structure in which the first bonding pads 22 are arranged in the first direction X adjacent to both edges of the first semiconductor chip 20 but a structure in which the first bonding pads 22 are arranged in the first direction X adjacent to the only one outer edge of the first semiconductor chip 20. When viewed in their entireties, four first semiconductor chips 20 are attached to the first surface of the substrate 10 in a face-down type position on both sides of the window W such that two first semiconductor chips 20 are arranged on each side of the window W in such a way as to be separated from each other and such that the outer edges of the first semiconductor chips 20, adjacent to which the first bonding pads 22 are arranged, project out of the substrate 10 in the second direction Y. The four first semiconductor chips 20 may be attached such that the outer side surfaces of the first semiconductor chips 20 are flush with corresponding side surfaces of the substrate 10 when viewed in the second direction Y. The first semiconductor chips 20 may be memory chips.

The second semiconductor chip 30 may have a quadrangular plate shape having an upper surface and a lower surface (i.e., lower surface 30b of FIG. 5) facing away from the upper surface (i.e., upper surface 30a of FIG. 5), and may be a center-pad type chip in which a plurality of second bonding pads 32 are arranged in one line or two lines, for example, two lines, at the center portion of the upper surface. The second semiconductor chip 30 may include therein internal circuits (not illustrated) which are formed to be electrically connected with the plurality of second bonding pads 32. The second semiconductor chip 30 may be a memory chip or a logic chip. The second semiconductor chip 30 may be attached to the four first semiconductor chips 20 in a face down position or face-down type position by the medium of the adhesive members 60 such that the second bonding pads 32 thereof are exposed through the window W of the substrate 10.

The adhesive members 60 may include, for example but not limited to, adhesive tapes or adhesive pastes. The adhesive members 60 may be interposed between the first surface of the substrate 10 and the upper surfaces of the first semiconductor chips 20. The adhesive members 60 may be interposed between the lower surfaces of the first semiconductor chips 20 and the upper surface of the second semiconductor chip 30.

The first connection members 72 may be conductive wires, and may be formed to electrically connect the first bond fingers 12a of the substrate 10 and the first bonding pads 22 of the first semiconductor chips 20 arranged adjacent to the first bond fingers 12a of the substrate 10.

The second connection members 74 may be conductive wires, and may be formed to electrically connect the second bonding pads 32 of the second semiconductor chip 30 and the second bond fingers 12b of the substrate 10, through the window W of the substrate 10.

The encapsulation member 80 may include, for example but not limited to, an epoxy molding compound, and may be formed on the first surface of the substrate 10 to cover the lower surface and the side surfaces of the second semiconductor chip 30. The encapsulation member 80 may be formed in the first direction X to cover both edge portions of the first semiconductor chips 20 including the first bonding pads 22 and both edge portions of the substrate 10 including the first bond fingers 12a, to cover the first connection members 72. In an embodiment, the encapsulation member 80 may be formed in the window W and on the portion of the second surface of the substrate 10 around the window W to cover the second connection members 74.

While, in various embodiments, the encapsulation member 80 is formed in the second direction Y to cover the edge portions including the side surfaces of the substrate 10 and the first semiconductor chips 20, it is to be noted that, unlike this, although not illustrated, the encapsulation member 80 may be formed in the second direction Y not to cover the side surfaces of the substrate 10 and the first semiconductor chips 20.

Figure 9:
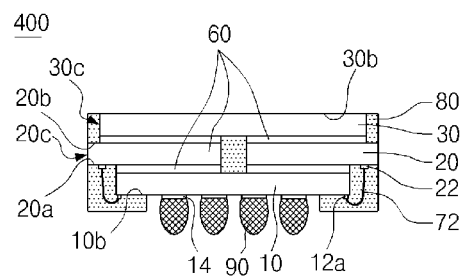
FIG. 9 is a cross-sectional view illustrating a representation of an example of a semiconductor package in accordance with an embodiment.

Referring to FIG. 9, in a semiconductor package 400 in accordance with an embodiment, the encapsulation member 80 may be formed not to cover the lower surface 30b of the second semiconductor chip 30 and to cover the side surfaces 30c of the second semiconductor chip 30. The encapsulation member 80 may be formed in the first direction X not to cover the outer side surfaces 20c of the first semiconductor chips 20 and to cover the edge portions of the upper surfaces 20a and the lower surfaces 20b of the first semiconductor chips 20.

The connection terminals 90 may be solder balls, and may be respectively attached to the external electrodes 14. The external electrodes 14 may be arranged on the second surface 10b of the substrate 10. In an embodiment, the connection terminals 90 may be, for example but not limited to, any ones of conductive pastes, conductive patterns and conductive pins.

Figure 10:
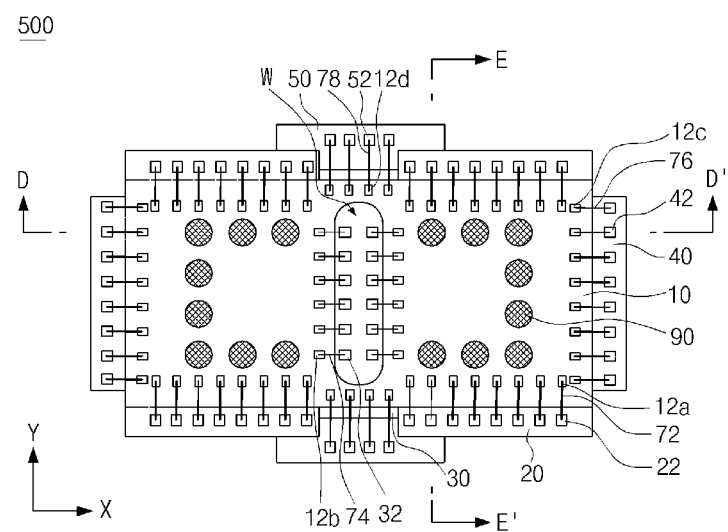
FIG. 10 is a bottom view illustrating a representation of an example of a semiconductor package with an encapsulation member removed, in accordance with an embodiment.
Figure 11:
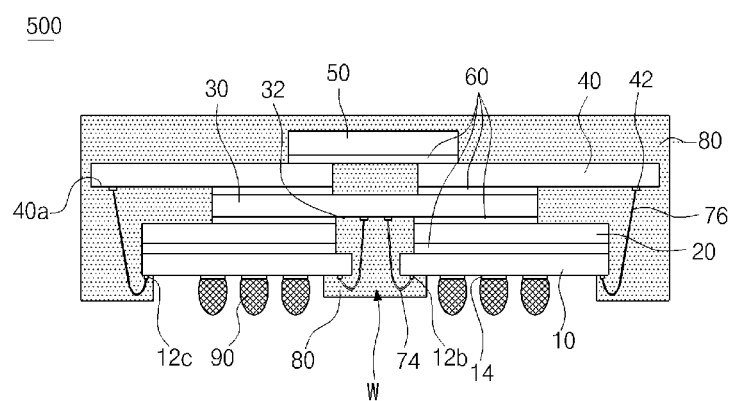
FIG. 11 is a cross-sectional view taken along the line D-D' of FIG. 10.
Figure 12:
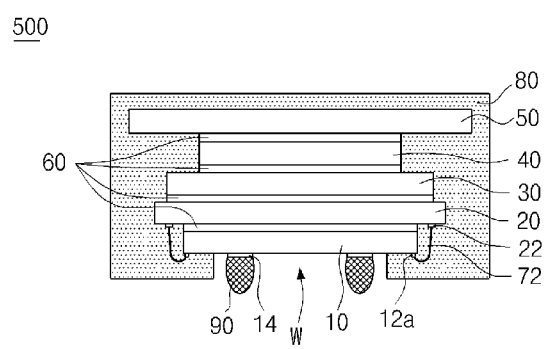
FIG. 12 is a cross-sectional view taken along the line E-E' of FIG. 10.

Referring to FIGS. 10 to 12, a semiconductor package 500 in accordance with an embodiment may include a substrate 10, and first to fourth semiconductor chips 20, 30, 40 and 50, respectively. The semiconductor package 500 may include first to fourth connection members 72, 74, 76 and 78, respectively. The semiconductor package 500 in accordance with an embodiment may further include adhesive members 60, an encapsulation member 80, and connection terminals 90.

The substrate 10 may be provided in the shape of a quadrangular plate having a first surface (i.e., 10a of FIG. 5) and a second surface (i.e., 10b or FIG. 5) facing away from the first surface. The substrate 10 may include pluralities of first to fourth bond fingers 12a, 12b, 12c and 12d, respectively. The substrate 10 may include a plurality of external electrodes 14, arranged on the second surface of the substrate 10.

The first bond fingers 12a are arranged in a first direction X adjacent to both edges of the substrate 10 on the second surface of the substrate 10. The second bond fingers 12b are arranged in a second direction Y adjacent to a window W on the second surface of the substrate 10. The third bond fingers 12c are arranged in the second direction Y adjacent to both edges of the substrate 10 on the second surface of the substrate 10. The fourth bond fingers 12d are arranged in the first direction X at portions adjacent to the window W and the first and where the second bond fingers 12a and 12b are not arranged, that is, at portions adjacent to both ends of the window W in the second direction Y, on the second surface of the substrate 10. In an embodiment the fourth bond fingers 12d are arranged in the first direction X at portions adjacent to both ends of the window W in the second direction Y and in a continuous space between the first bond fingers 12a in the first direction X on the second surface of the substrate 10 as illustrated in FIG. 10. The external electrodes 14 are arranged at portions surrounded by the first bond fingers 12a, the second bond fingers 12b and the third bond fingers 12c on the second surface of the substrate 10.

Each of the first semiconductor chips 20 may be an edge-pad type chip in which a plurality of first bonding pads 22 are arranged in the first direction X adjacent to the edges of the upper surface thereof, and the first semiconductor chips 20 are attached to the first surface of the substrate 10 in a face-down type position with the adhesive member 60 interposed between the first semiconductor chips 20 and the substrate 10 such that the edges thereof, adjacent to which the first bonding pads 22 are arranged, project out over the perimeter of the substrate 10 in the second direction Y. In the same manner as in the embodiments illustrated in FIGS. 1 to 3, the first semiconductor chip 20 may have a structure in which the plurality of first bonding pads 22 are arranged in the first direction X adjacent to both edges of the first semiconductor chip 20. In an embodiment, although not illustrated, in the same manner as in the embodiments illustrated in FIGS. 7 and 8, the first semiconductor chip 20 may have a structure in which the plurality of first bonding pads 22 are arranged adjacent to only one outer edge of each of the first semiconductor chips 20.

The second semiconductor chip 30 may be a center-pad type chip in which a plurality of second bonding pads 32 are arranged at the center portion of the upper surface (i.e., 30a of FIG. 5) of the second semiconductor chip 30, and is attached to the first semiconductor chips 20 in a face-down type position with the adhesive members 60 interposed between the second semiconductor chip 30 and the first semiconductor chips 20 such that the second bonding pads 32 are exposed through the window W of the substrate 10.

Each of the third semiconductor chips 40 may include a plurality of third bonding pads 42 arranged in the second direction Y adjacent to the outer edge of the third semiconductor chip 40. For example, the third bonding pads 42 may be arranged in the second direction Y adjacent to one outer edge of the third semiconductor chip 40 on the upper surface 40a of the third semiconductor chip 40. Two third semiconductor chips 40 are attached to the second semiconductor chip 30 in a face-down type position with the adhesive members 60 interposed between the third semiconductor chips 40 and the second semiconductor chip 30 such that one outer edges of the third semiconductor chips 40, adjacent to which the third bonding pads 42 are arranged, project out of both ends of the perimeter of substrate 10 in the first direction X, with the two third semiconductor chips 40 separated from each other. For example, the third semiconductor chip 40 may have a length longer than the first semiconductor chip 20 in the first direction X, and a width smaller than the first semiconductor chip 20 in the second direction Y. The third semiconductor chips 40 may be memory chips.

In an embodiment, although not illustrated, a third semiconductor chip 40 may have a structure in which a plurality of third bonding pads 42 are arranged in the second direction Y adjacent to both edges of the third semiconductor chip 40, and such one third semiconductor chip 40 may be attached to the second semiconductor chip 30 such that both edges of the third semiconductor chip 40, adjacent to which the third bonding pads 42 are arranged, project out over both ends of the perimeter of substrate 10 in the first direction X. Accordingly, the third semiconductor chip 40 may have a length longer than the substrate 10 in the first direction X, and a width smaller than the first semiconductor chip 20 in the second direction Y. In this example, it is to be understood that only one third semiconductor chip 40 is attached to the second semiconductor chip 30.

The fourth semiconductor chip 50 may be an edge-pad type chip in which a plurality of fourth bonding pads 52 are arranged in the first direction X adjacent to the edges of the fourth semiconductor chip 50. Such a fourth semiconductor chip 50 may be attached to the third semiconductor chips 40 in a face-down type position with the adhesive member 60 interposed between the fourth semiconductor chip 50 and the third semiconductor chips 40 such that the edges of the fourth semiconductor chip 50, adjacent to which the fourth bonding pads 52 are arranged, project in the second direction Y. For example, the fourth semiconductor chip 50 may have a width larger than the width of the second semiconductor chip 30 in the second direction Y, and the length of the fourth semiconductor chip 50 in the first direction X is not limited. The fourth bonding pads 52 of the fourth semiconductor chip 50 may be arranged at portions adjacent to the fourth bond fingers 12d of the substrate 10, that is, may be disposed in the space between the third semiconductor chips 40. The fourth semiconductor chip 50 may be a memory chip.

The first connection members 72 may be formed to electrically connect the first bond fingers 12a of the substrate 10 which are arranged in the first direction X adjacent to the edges of the substrate 10 and the first bonding pads 22 of the first semiconductor chips 20 which are arranged adjacent to the first bond fingers 12a of the substrate 10. The second connection members 74 may be formed to electrically connect the second bond fingers 12b of the substrate 10 which are arranged in the second direction Y adjacent to the window W of the substrate 10 and the second bonding pads 32 of the second semiconductor chip 30 which are exposed through the window W.

The third connection members 76 may be formed to electrically connect the third bond fingers 12c of the substrate 10 which are arranged in the second direction Y adjacent to the edges of the substrate 10 and the third bonding pads 42 of the third semiconductor chips 40 which are arranged adjacent to the third bond fingers 12c of the substrate 10. The fourth connection members 78 may be formed to electrically connect the fourth bond fingers 12d of the substrate 10 which are arranged in the first direction X adjacent to both ends of the window W of the substrate 10 and the fourth bonding pads 52 of the fourth semiconductor chip 50 which are arranged adjacent to the fourth bond fingers 12d of the substrate 10.

In the semiconductor package 500 in accordance with an embodiment, the first to fourth connection members 72, 74, 76 and 78 may include conductive wires formed of a metallic material such as, for example but not limited to, gold, silver or copper. Since such first to fourth connection members 72, 74, 76 and 78 are formed at different positions and thus interference is reduced, a short circuit issue may not occur among the first to fourth connection members 72, 74, 76 and 78 in the semiconductor package 500 in accordance with the various embodiments.

The adhesive members 60 may include, for example but not limited to, adhesive pastes or adhesive tapes, and may be interposed between the first surface of the substrate 10 and the first semiconductor chips 20, between the first semiconductor chips 20 and the second semiconductor chip 30, between the second semiconductor chip 30 and the third semiconductor chips 40, and between the third semiconductor chips 40 and the fourth semiconductor chip 50.

The encapsulation member 80 may be formed on the first surface of the substrate 10 to cover the first to fourth semiconductor chips 20, 30, 40 and 50. The encapsulation member 80 may be formed to cover the side surfaces and the lower surfaces of the first to fourth semiconductor chips 20, 30, 40 and 50, the first, third and fourth connection members 72, 76 and 78, and the side surfaces and the edge portions of the second surface of the substrate 10. The encapsulation member 80 may be formed in the window W and on the portion of the second surface of the substrate 10 around the window W to cover the second connection members 74 and fill the window W.

The connection terminals 90 may be solder balls, and may be respectively attached to the external electrodes 14 arranged on the second surface of the substrate 10. In an embodiment, the connection terminals 90 may be, for example but not limited to, any ones of conductive pastes, conductive patterns and conductive pins.

In the semiconductor package 500 in accordance with the various embodiments, by configuring the first to third semiconductor chips 20, 30 and 40 as memory chips and configuring the fourth semiconductor chip 50 as a logic chip, it may be possible to realize an SIP (system in package).

Figure 13:
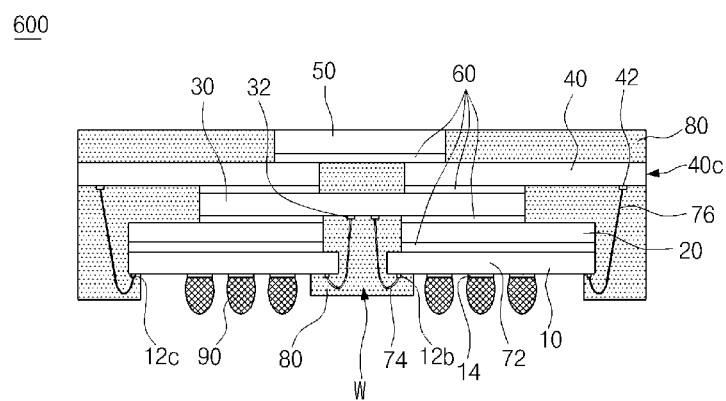
FIGS. 13 and 14 are cross-sectional views illustrating a representation of an example of a semiconductor package in accordance with an embodiment.
Figure 14:
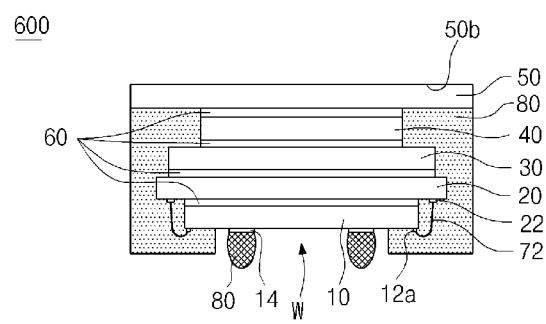

FIGS. 13 and 14 contain similar elements as those discussed with relation to FIGS. 10-12, however, in the semiconductor package 600 in accordance with an embodiment, the encapsulation member 80 may be formed not to cover the outer side surfaces 40c of the third semiconductor chips 40 when viewed in the second direction Y. The encapsulation member 80 may be formed not to cover the lower surface 50b of the fourth semiconductor chip 50. The encapsulation member 80 may also be formed not to cover the outer side surfaces of the third semiconductor chips 40 when viewed in the first direction X. In the semiconductor package 600 in accordance with an embodiment, since the heat generated from the third and fourth semiconductor chips 40 and 50 may be dissipated to an exterior, thermal performance may be improved.

The semiconductor packages according to the above-described various embodiments may be applied to various kinds of semiconductor devices and package modules having the same.

Figure 15:
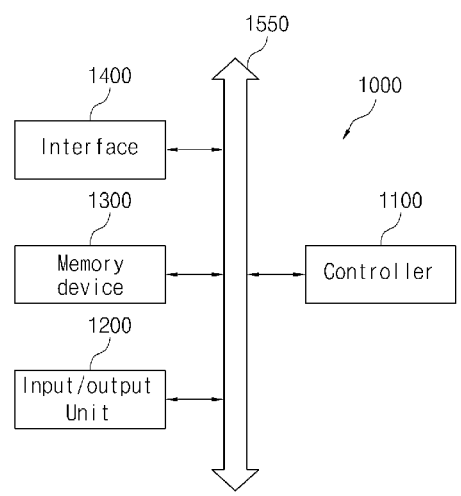
FIG. 15 is a block diagram illustrating a representation of an example of an electronic system which the semiconductor package in accordance with each of the various embodiments may be applied.

Referring to FIG. 15, an electronic system 1000, to which the semiconductor package in accordance with each of the various embodiments is applied, may include a controller 1100, an input/output unit 1200, and a memory device 1300. The controller 1100, the input/output unit 1200 and the memory device 1300 may be electrically coupled with one another through a bus 1550 which provides data movement paths.

For example, the controller 1100 may include at least any one of a microprocessor, a digital signal processor, a microcontroller, and logic devices capable of performing similar functions to these components. The controller 1100 and the memory device 1300 may include the semiconductor packages in accordance with the various embodiments. The input/output unit 1200 may include at least one selected among a keypad, a keyboard, a display device, and so forth.

The memory device 1300 may store data and/or commands to be executed by the controller 1100. The memory device 1300 may include a volatile memory device such as a DRAM and/or a nonvolatile memory device such as a flash memory. For example, a flash memory may be mounted to an information processing system such as a mobile terminal and a desktop computer. Such a flash memory may be configured by an SSD (solid state drive). In this case, the electronic system 1000 may stably store a large amount of data in a flash memory system.

Such an electronic system 1000 may further include an interface 1400 for transmitting data to a communication network or receiving data from a communication network. The interface 1400 may be a wired or wireless type. For example, the interface 1400 may include an antenna or a wired/wireless transceiver.

Meanwhile, although not shown, the electronic system 1000 may further include an application chipset, a camera image processor (CIP), an input/output device, and so forth.

The electronic system 1000 may be realized as a mobile system, a personal computer, a computer for an industrial use or a logic system which performs various functions. For example, the mobile system may be any one among a personal digital assistant (PDA), a portable computer, a web tablet, a mobile phone, a smart phone, a wireless phone, a laptop computer, a memory card, a digital music system and an information transmission/reception system.

In the example where the electronic system 1000 is equipment capable of performing wireless communication, the electronic system 1000 may be used in a communication system such as CDMA (code division multiple access), GSM (global system for mobile communication), NADC (North American digital cellular), E-TDMA (enhanced-time division multiple access), WCDMA (wideband code division multiple access), CDMA2000, LTE (long term evolution) and Wibro (wireless broadband Internet).

Figure 16:
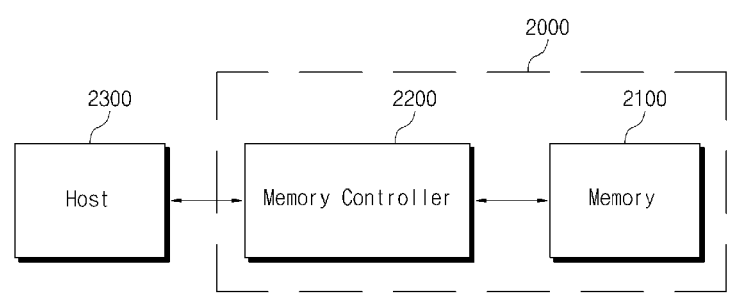
FIG. 16 is a block diagram illustrating a representation of an example of a memory card including the semiconductor package in accordance with each of the various embodiments.

Referring to FIG. 16, a memory card 2000 may include the semiconductor package in accordance with each of the various embodiments, may include a memory 2100 and a memory controller 2200. For example, but not limited to, the memory controller 2200 may comprise a nonvolatile memory device. The memory 2100 and the memory controller 2200 may store data or read stored data.

The memory 2100 may include at least any one among nonvolatile memory devices to which the semiconductor packages in accordance with the embodiments are applied, and the memory controller 2200 may control the memory 2100 to read stored data or store data, in response to a read/write request from a host 2300.

While various embodiments have been described above, it will be understood to those skilled in the art that the embodiments described are by way of example only. Accordingly, the semiconductor package with a plurality of stacked chips described herein should not be limited based on the described embodiments.

What is claimed is:

1. A semiconductor package comprising:
   a substrate having a first surface and a second surface facing away from the first surface, a window defined through a center portion of the substrate, and a plurality of first bond fingers, a plurality of second bond fingers, and a plurality of external electrodes arranged on the second surface;
   two or more first semiconductor chips each having a plurality of first bonding pads arranged adjacent to edges of the first semiconductor chips, and each of the first semiconductor chips separately attached to the first surface of the substrate in a face-down type position exposing the first bonding pads; and
   a second semiconductor chip having a plurality of second bonding pads arranged at a center portion of the second semiconductor chip, and attached to each of the first semiconductor chips in a face-down type position exposing the second bonding pads through the window,
   wherein the first semiconductor chips are attached allowing the edges of the first semiconductor chips to project outwardly relative to the outer edges of the substrate in a second direction substantially perpendicular to a first direction, and have a structure in which the first bonding pads are arranged adjacent to the projecting edges,
   wherein the first bond fingers are arranged on the second surface of the substrate in the first direction adjacent to edges of the substrate, and the second bond fingers are arranged on the second surface of the substrate in the second direction adjacent to the window,
   wherein the first bonding pads are arranged in the first direction adjacent to edges of the first semiconductor chips, and
   wherein the second bonding pads are arranged in the second direction at a center portion of the second semiconductor chip.

2. The semiconductor package according to claim 1, further comprising:
   a plurality of first connection members electrically coupling the first bonding pads and the first bond fingers; and
   a plurality of second connection members electrically coupling the second bonding pads and the second bond fingers through the window.

3. The semiconductor package according to claim 1, wherein two first semiconductor chips are respectively attached to the first surface of the substrate on both sides of the window.

4. The semiconductor package according to claim 1, wherein four first semiconductor chips are attached to the first surface of the substrate allowing outer edges of two first semiconductor chips to project in the second direction on each side of the window, and have a structure in which the first bonding pads are arranged adjacent to the projecting outer edges.

5. The semiconductor package according to claim 2, wherein the first connection members and the second connection members comprise conductive wires.

6. The semiconductor package according to claim 2, further comprising:
   adhesive members interposed between the first surface of the substrate and the first semiconductor chips and between the first semiconductor chips and the second semiconductor chip; and
   an encapsulation member formed to cover the first and second semiconductor chips and the first and second connection members, and to fill the window.

7. The semiconductor package according to claim 1, further comprising:
   an encapsulation member formed to cover the first surface and side surfaces of the substrate and lower surfaces and side surfaces of the first and second semiconductor chips, and to cover edge portions of the second surface and the window of the substrate, in the first direction and the second direction perpendicular to the first direction.

8. The semiconductor package according to claim 1, further comprising:
   an encapsulation member formed to expose both side surfaces of the substrate with relation to the second direction and side surfaces of the first semiconductor chips corresponding thereto, and cover both side surfaces and edge portions of the substrate and the first semiconductor chips with relation to the second direction perpendicular to the first direction.

9. The semiconductor package according to claim 2, further comprising:
   an encapsulation member formed to cover side surfaces and the lower surface of the second semiconductor chip or formed to cover only the side surfaces of the second semiconductor chip.

10. The semiconductor package according to claim 2, further comprising:
    two or more third semiconductor chips each having a plurality of third bonding pads arranged adjacent to outer edges of the third semiconductor chips in a direction substantially perpendicular to an arrangement direction of the first bonding pads, and each of the third semiconductor chips separately attached to the second semiconductor chip in a face-down type position such that the outer edges, adjacent to which the third bonding pads are arranged, project outward;
    a fourth semiconductor chip having a plurality of fourth bonding pads arranged adjacent to edges of the fourth semiconductor chip in substantially the same direction as the arrangement direction of the first bonding pads, and attached to the third semiconductor chips in a face-down type position such that the edges, adjacent to which the fourth bonding pads are arranged, project outward;
    a plurality of third bond fingers arranged adjacent to edges of the substrate adjacent to the third bonding pads;
    a plurality of fourth bond fingers arranged adjacent to edges of the substrate adjacent to the fourth bonding pads;
    a plurality of third connection members electrically coupling the third bonding pads of the third semiconductor chips and the third bond fingers of the substrate; and
    a plurality of fourth connection members electrically coupling the fourth bonding pads of the fourth semiconductor chip and the fourth bond fingers of the substrate.

11. The semiconductor package according to claim 10, wherein the plurality of third bonding pads are arranged adjacent to one outer edges of the third semiconductor chips, and the third semiconductor chips are attached to the second semiconductor chip on both sides of the window allowing the one outer edges of the third semiconductor chips, adjacent to which the third bonding pads are arranged, project outward.

12. The semiconductor package according to claim 10, wherein the fourth semiconductor chip is attached to the third semiconductor chips such that edges of the fourth semiconductor chip project outward, and has a structure in which the plurality of fourth bonding pads are arranged adjacent to the projecting edges.

13. The semiconductor package according to claim 10, wherein the third connection members and the fourth connection members comprise conductive wires.

14. The semiconductor package according to claim 10, further comprising:
   adhesive members interposed between the first surface of the substrate and the first semiconductor chips, between the first semiconductor chips and the second semiconductor chip, between the second semiconductor chip and the third semiconductor chips, and between the third semiconductor chips and the fourth semiconductor chip; and
   an encapsulation member configured to cover the first to fourth semiconductor chips and the first to fourth connection members and to fill the window.

15. The semiconductor package according to claim 10, wherein the first bond fingers are arranged on the second surface of the substrate in a first direction adjacent to edges of the substrate, and the second bond fingers are arranged on the second surface of the substrate in a second direction substantially perpendicular to the first direction and adjacent to the window, and further comprising:
   an encapsulation member formed to cover the first surface and side surfaces of the substrate and lower surfaces and side surfaces of the first to fourth semiconductor chips, and to cover edge portions of the second surface and the window of the substrate, in the first direction and the second direction perpendicular to the first direction.

16. The semiconductor package according to claim 10, wherein the first bond fingers are arranged on the second surface of the substrate in a first direction adjacent to edges of the substrate, and the second bond fingers are arranged on the second surface of the substrate in a second direction substantially perpendicular to the first direction and adjacent to the window, and further comprising:
   an encapsulation member formed to expose outer side surfaces of the third semiconductor chips with relation to the second direction, and to expose both side surfaces of the fourth semiconductor chip with relation to the first direction perpendicular to the second direction.

17. The semiconductor package according to claim 10, wherein the first bond fingers are arranged on the second surface of the substrate in a first direction adjacent to edges of the substrate, and the second bond fingers are arranged on the second surface of the substrate in a second direction substantially perpendicular to the first direction and adjacent to the window, and further comprising:
   an encapsulation member formed to cover side surfaces and the lower surface of the fourth semiconductor chip or formed to cover only the side surfaces of the fourth semiconductor chip with regards to the second direction.

* * * * *